United States Patent
Gerber et al.

(10) Patent No.: US 11,735,643 B2
(45) Date of Patent: Aug. 22, 2023

(54) HETEROGENEOUS STRUCTURES COMPRISING III-V SEMICONDUCTORS AND METAL OXIDE DIELECTRICS, AND A METHOD OF FABRICATION THEREOF

(71) Applicant: Ramot at Tel-Aviv University Ltd., Tel Aviv (IL)

(72) Inventors: Alexander Gerber, Tel Aviv (IL); Gregory Kopnov, Tel Aviv (IL)

(73) Assignee: RAMOT AT TEL-AVIV UNIVERSITY LTD., Tel Aviv (IL)

( * ) Notice: Subject to any disclaimer, the term of this patent is extended or adjusted under 35 U.S.C. 154(b) by 425 days.

(21) Appl. No.: 17/067,874

(22) Filed: Oct. 12, 2020

(65) Prior Publication Data
US 2021/0126107 A1 Apr. 29, 2021

Related U.S. Application Data

(60) Provisional application No. 62/926,702, filed on Oct. 28, 2019.

(51) Int. Cl.
| | | |
|---|---|---|
| *H01L 29/12* | (2006.01) | |
| *H01L 29/66* | (2006.01) | |
| *H01L 29/778* | (2006.01) | |
| *G01R 33/07* | (2006.01) | |

(52) U.S. Cl.
CPC ........ *H01L 29/66462* (2013.01); *G01R 33/07* (2013.01); *H01L 29/7786* (2013.01)

(58) Field of Classification Search
CPC .......... H01L 21/02107–02362; H01L 21/02387–02398; H01L 21/02455–02466; H01L 21/02538–02549; H01L 21/28264; H01L 21/31666; H01L 29/2003; H01L 29/20–207; H01L 29/66446–66469; H01L 29/778–7789
See application file for complete search history.

(56) References Cited

U.S. PATENT DOCUMENTS

| | | | |
|---|---|---|---|
| 5,665,658 A * | 9/1997 | Passlack | H01L 21/31604 438/763 |
| 2006/0003086 A1* | 1/2006 | Takase | H01J 11/12 445/24 |

OTHER PUBLICATIONS

"Unpinned gallium oxide/GaAs interface by hydrogen and nitrogen surface plasma treatment" in Appl. Phys. Lett. 54, 332 (1989) to A. Callegari, P. D. Hoh, D. A. Buchanan, et al., (Year: 1989).*
Wikipedia pages on Gallium arsenide, Charge carrier density, and Electron mobility (Year: 2023).*
"Preparation of MgO Thin Films by RF Magnetron Sputtering" Yasuhisa Kaneko et al. 1991 Jpn. J. Appl. Phys. 30 1091, (Year: 1991).*

(Continued)

*Primary Examiner* — Eric A. Ward
(74) *Attorney, Agent, or Firm* — The Roy Gross Law Firm, LLC; Roy Gross

(57) ABSTRACT

Systems and methods for passivation of III-V semiconductors to create heterogeneous structures based on such semiconductors, to the structures themselves, and to devices using passivated III-V semiconductors, such as metal oxide-semiconductor field effect transistors (MOSFET) and Hall effect sensors using III-V semiconductors.

7 Claims, 8 Drawing Sheets

(56) References Cited

OTHER PUBLICATIONS

"Empirical low-field mobility model for III-V compounds applicable in device simulation codes" by M. Sotoodeh, A. H. Khalid, and A. A. Rezazadeh in Journal of Applied Physics 87, 2890 (2000), (Year: 2000).*

"The Dopant Density and Temperature Dependence of Electron Mobility and Resistivity in N-type Silicon" by Sheng S. Li in U.S. Department of Commerce NBS Special Publication 400-33 (1977). (Year: 1977).*

High Electron Mobility Transistor Logic, Takashi Mimura, Kazukiyo Joshin, Satoshi Hiyamizu, Kohki Hikosaka and Masayuki Abe, Jpn. J. Appl. Phys. 20 L598 (1981).

Wu, Y. Q.; Xu, M.; Ye, P. D.; Cheng, Z.; Li, J.; Park, J.-S.; Hydrick, J.; Bai, J.; Carroll, M.; Fiorenza, J. G.; Lochtefeld, A. Appl. Phys. Lett. 2008, 93, 242106.

De Souza, J. P.; Kiewra, E.; Sun, Y.; Callegari, A.; Sadana, D. K.; Shahidi, G.; Webb, D. J.; Fompeyrine, J.; Germann, R.; Rossel, C.; Marchiori, C. Appl. Phys. Lett. 2008, 92, 153508.

J. Nah, H. Fang, C. Wang, K. Takei, M.H. Lee, E. Plis, S. Krishna, and A. Javet, III-V complementary metal-oxide-semiconductor electronics on silicon substrates, Nano Lett. 12 (2012) 3592-3595, doi:10.1021/nl301254z.

J. A. del Alamo. Nanometre-scale electronics with III-V compound semiconductors. Nature 479, 317-323 (2011).

H. Hasegawa, et al. Surface passivation of III-V semiconductors for future CMOS devices—Past research, present status and key issues for future Applied Surface Science 256, 5698 (2010) https://www.sciencedirect.com/science/article/pii/S016943321000382X.

Hideki Hasegawa, Masamichi Akazawa. Surface passivation technology for III-V semiconductor nanoelectronics. Applied Surface Science, vol. 255:628-632 (2008) https://www.sciencedirect.com/science/article/pii/S0169433208015754.

Michel Houssa, Evgueni Chagarov and Andrew Kummel. Surface Defects and Passivation of Ge and III-V Interfaces. https://www.cambridge.org/core/journals/mrs-bulletin/article/surface-defects-and-passivation-of-ge-and-iiiv-interfaces/74CA9F17EE9E85B03B4D7FFOAFE4DA9A (2011).

M. L. Huang, Y. C. Chang, C. H. Chang, Y. J. Lee, and P. Chang. Surface passivation of III-V compound semiconductors using atomic-layer-deposition-grown Al2O3. Appl. Phys. Lett. 87, 252104 (2005); https://aip.scitation.org/doi/abs/10.1063/1.2146060.

D. Shahrjerdi, Junghyo Nah, B. Hekmatshoar and Tarik Akyol. Hall mobility measurements in enhancement-mode GaAs field-effect transistors with Al2O3 gate dielectric. Applied Physics Letters, 97(21):213506-213506-3 (2010).

* cited by examiner

HETEROGENEOUS STRUCTURES COMPRISING III-V SEMICONDUCTORS AND METAL OXIDE DIELECTRICS, AND A METHOD OF FABRICATION THEREOF

FIELD OF THE INVENTION

The present invention is directed to systems and methods for passivation of III-V semiconductors to create heterogeneous structures based on such semiconductors. The present invention is directed to the heterogeneous structures themselves, and to devices using passivated III-V semiconductors.

BACKGROUND OF THE INVENTION

Formation of a protective layer (for example, a metal oxide dielectric) on a semiconductor is generally called passivation of the semiconductor surface. A similar heterogeneous structure having a semiconductor layer and a metal oxide dielectric layer is required in many semiconductor devices (although the dielectric layer is needed there for operation of such devices and not for protection of the semiconductor).

Electron mobility in bulk III-V semiconductors is about an order of magnitude higher than in silicon, which promises much faster nanometer-scale electronics in III-V semiconductor-based devices (for example, in gallium arsenide GaAs-based devices). Thus, it is logical, that such semiconductors are the desired base for modern semiconductor devices like transistors, sensors, and other such devices that use semiconductors.

However, fabrication of metal oxide—semiconductor field effect transistors (MOSFETs), the central element of the modern electronics, with III-V semiconductors has been hampered for years by the unresolved problem of the semiconductor to metal-oxide interface. Namely, exposure of the III-V surface to oxygen results in appearance of the interfacial states that reduce the charge mobility and cause 'Fermi-level pinning', which is an inability to modulate the electrostatic potential inside the semiconductor.

The defects are attributed to a number of native surface species including Ga and As oxides and sub-oxides, elemental As, As—As dimers and Ga dangling bonds.

Multiple methods of GaAs surface passivation have been tried, including formation of native oxides by thermal, anodic and plasma oxidations, and deposition of various insulators by thermal, plasma, chemical vapor deposition and other more exotic techniques.

Unfortunately all these efforts had limited success. One such effort was the discovery that a stable oxide $Ga_2O_3$ deposited in situ on GaAs yields an interface free of the Fermi-level pinning with the quality close to that of the AlGaAs/GaAs interface. Unfortunately, $Ga_2O_3$ by itself is not suitable to serve as a high permeability insulator in the MOSFET stack because of high oxide bulk trap densities and excessive leakage current.

The second advance was an accidental discovery of the interface self-cleaning effect that takes place when oxides like $Al_2O_3$ are deposited on GaAs by atomic layer deposition (ALD). The native GaAs surface oxides are largely eliminated at the very early stages of ALD, and subsequent exposure to the ALD oxidant does not regrow the III-V oxides. ALD passivating is problematic as it suffers from deficiencies.

Thus, there is a long-felt need in a new, simpler, more versatile, more effective and preferably not more expensive technique for semiconductor passivation which would ensure highly active interfaces between a semiconductor and a dielectric.

SUMMARY OF THE INVENTION

An object of the present invention is to overcome the above-mentioned disadvantages of the known technologies and to solve issues with regards to passivation of the semiconductor surface.

An object of the present invention is to provide heterogeneous structures that are preferably an assembly of layers, in particular when a layer of insulator (such as a metal oxide) is grown on top of a semiconductor (such as a III-V semiconductor).

More specifically, objects of the invention involve providing a solution which would preserve undamaged the interface formed by passivation between a semiconductor and the protective layer (such as a metal oxide dielectric).

Additional objects of the present invention involve providing an improved method of passivating semiconductors, that results in the semiconductor surface layer (bordering the protective layer), which has the same or close to the same charge mobility properties as the initial, clean bulk of the semiconductor.

According to a first aspect of the invention, a method for passivating a semiconductor is provided by using an RF sputtering technique of growing a dielectric on a surface of the semiconductor, wherein the technique is improved by ensuring presence of oxygen while sputtering.

In certain embodiments, the semiconductor is a III-V semiconductor. In certain embodiments, the dielectric is a metal oxide dielectric.

In certain embodiments, the passivation should be understood as a self-cleaning process which provides, to the layer/region close to the mentioned surface of the semiconductor, a charge mobility close to that existing inside a bulk of that semiconductor.

In certain embodiments, the RF ("radio frequency") sputtering may be understood as a non-DC ("direction constant") sputtering performed at an arbitrary frequency.

In certain embodiments, The semiconductor is preferably a III-V semiconductor, for example Gallium arsenide (GaAs), while the dielectric is preferably one or more metal oxide dielectrics.

The process of passivating the semiconductor, as defined above, comprises fabrication of a heterogeneous structure with is free of pinning, high charge mobility interface between the semiconductor and the dielectric.

According to a second aspect of the invention, the above-defined passivation method may be presented as a method of fabrication (or of manufacturing) of a heterogeneous structure comprising a semiconductor (preferably, a III-V semiconductor) and a layer of a dielectric (preferably, a metal oxide dielectric) grown on a surface of the semiconductor, with a high mobility interface between the semiconductor and the dielectric.

More specifically, the fabricating (or manufacturing) of a heterogeneous structure by passivation of a III-V semiconductor surface, during deposition of a metal oxide onto the semiconductor surface, occurs by using RF sputtering, preferably a reactive RF sputtering in an atmosphere comprising an inert gas and oxygen.

The high mobility interface may be understood as that formed between the dielectric and a surface layer of a semiconductor bulk, wherein the surface layer having a charge mobility close to the charge mobility of the bulk semiconductor, or even higher.

According to a third aspect of the invention, a heterogeneous structure per se is provided. The novel heterogeneous structure comprises a semiconductor (for example, III-V semiconductor) and a layer of a dielectric (for example, a metal oxide dielectric grown on a surface of the semiconductor), with a high mobility interface between the dielectric and the semiconductor.

In certain embodiments, the surface layer of the semiconductor surface has a charge mobility μ close to the charge mobility of the bulk semiconductor. In certain embodiments, the charge mobility may be higher than 10' $cm^2$/Vsec and even higher than 2000 $cm^2$/Vsec.

Further, the charge mobility of the obtained interface may be controlled by controlling power of RF sputtering. For example, a range from of about 100 W to about 150 W of sputtering power $P_{RF}$ may control mobility p of the interface GaAs(O)/MgO in a range from about 1000 to more than 3000 $cm^2$/Vs.

In certain embodiments, the charge mobility (i.e., Hall mobility) is measured by Hall effect measurements.

The novel heterogeneous structure may be manufactured by the method of fabrication of a heterogeneous structure.

As described above, forming of high mobility interfaces (for example, between III-V semiconductors and metal oxides) may be achieved by creating high mobility conducting channels at such interfaces due to presence of oxygen (02) in a chamber where the sputtering is performed. (These high mobility conducting channels are actually the purpose of passivation of the semiconductor).

The percentage of oxygen in the atmosphere of a chamber may be in a range from about 0.01% to of about 90%. The oxygen may be added to an inert gas, for example Ar. Other inert gases may be used, for example neon, krypton or xenon.

It should be noted that relatively low presence of oxygen may be ensured by using, for the sputtering, a target item comprising the respective metal oxide and adsorbed oxygen containing species, for example, $H_2O$, $CO_2$ etc. Higher doses of oxygen may be added controllably.

The sputtering may be direct, i.e. no additional procedures like chemical or thermal treatments are performed/required in the direct sputtering.

The method/process may be controllable and may comprise, for example:
controllably affecting the charge carrier density and mobility, by controllably adding oxygen controllably changing the charge carrier mobility by regulating power of the sputtering, and/or time of deposition,
controllably changing/selecting conductivity (i.e., the charge carrier density) by using variously doped semiconductors,
modulating the charge carrier density by a wide spectrum light and/or by illumination in the selected frequency range, etc.

It should be noted embodiments of the invention involve use of GaAs to form structures with the desired high mobility interface, at least by sputtering. It should be noted embodiments of the invention are directed to a novel GaAs structure per se.

Further, embodiments of the invention are directed to providing that metal oxides MgO or $HfO_2$, etc. (which are much better for MOSFET transistors and other devices), can be well deposited according to the proposed inventive technique (while they cannot be deposited by other, known techniques).

It should also be noted that the semiconductor (for example III-V semiconductor, say GaAs) may initially be a semi-insulating, non-doped semiconductor. Before the proposed treatment, such a semiconductor behaves as an insulator.

Alternatively, it may be an n-type or a p-type doped semiconductor having semi-conducting properties due to mobile charge carriers provided by a dopant.

It should be emphasized that the technique proposed by embodiments of the invention ensures creating the interface with high mobility both in doped, and in non-doped semiconductors.

Still more specifically, in the proposed technique and in the proposed structure said dielectrics may be metal oxides, for example, such as MgO, $SiO_2$, $HfO_2$, ZnO, $Al_2O_3$. Combinations of the above dielectrics and other metal oxide dielectrics are also possible.

The proposed heterogenous structure with a high mobility interface, especially the structure comprising GaAs+MgO or HfO, ZnO—is novel, since by now it could not be created by any known technique. Such a structure is highly suitable for a MOSFET.

In particular, the embodiments of the invention involve fabricating (or manufacturing) the high mobility interface between GaAs and metal oxide dielectrics, and on obtaining the following structure. Exposure of the untreated semi-insulating GaAs wafers to the Ar/02 plasma during reactive RF sputtering of metal oxides leads to formation of the n-type conducting interfacial channel with the planar charge density between $10^7$ to $10^{10}$ cm-2, resistance down to $10^5 \Omega$/ (Ohm per a square sample of semiconductor), and Hall mobility up to 6000 $cm^2$/Vsec. Such a high mobility is close to that found in GaAs/AlGaAs heterostructures and is much larger than reported in any III-V semiconductor-metal oxide systems.

In embodiments of the invention, during reactive RF sputtering of metal oxide dielectrics on an arbitrary (untreated) oxidized GaAs surface, a process of self-cleaning takes place and an electrically conducting channel with high electron mobility is formed at the interface between GaAs and the dielectric. As already mentioned, this effect was unknown by now. A possibility to control this effect by deliberately (and even controllably) adding oxygen to the sputtering camera was all the more unknown.

According to yet a further aspect of the invention, the heterogeneous structure may form (or may be used for forming) a MOSFET device.

In another embodiment, the proposed heterogeneous structure may form part of a Hall effect sensor/device.

In another embodiments, it was found that the charge carrier density is controllable by a wide spectrum light and/or by illumination in a selected frequency range.

Other objects of the invention are achieved by providing a method for passivating a semiconductor by an RF sputtering technique of growing a dielectric on a surface of the semiconductor, wherein said technique is performed in presence of oxygen.

Other objects of the invention and its particular features and advantages will become more apparent from consideration of the following drawings and accompanying detailed description. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The invention will be further described and illustrated with reference to the embodiments and features presented in the following non-limiting drawings, in which.

DETAILED DESCRIPTION OF THE INVENTION

Figure 1:
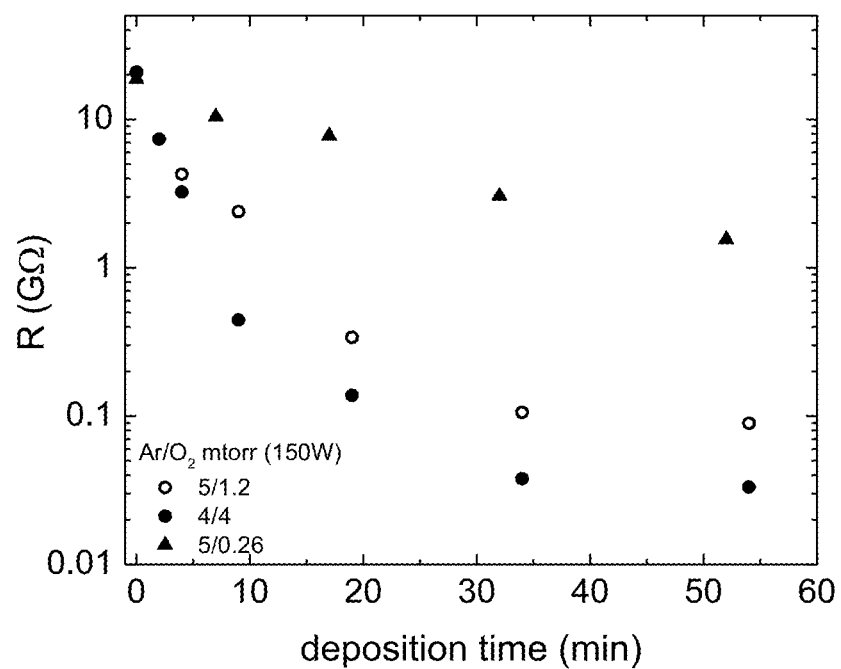
FIG. 1 presents the resistance of a semi-insulating GaAs wafer sample measured in situ during the RF sputtering deposition of MgO in Ar/O$_2$ atmosphere at different partial pressures of argon and oxygen. Specifically, the figure shows resistance of GaAs wafer samples as a function of the deposition time measured in situ during the RF sputtering of MgO in Ar/O$_2$ atmosphere. The shown data were taken during three deposition sequences at 150 W RF power at argon/oxygen partial pressures of 5/0.25, 5/1.2 and 4/4 mtorr. The four-probe resistance measurement in the Van der Paw configuration was performed with switched-off RF power. Deposition was resumed after each measurement.

In the following description, numerous details are set forth for the purpose of explanation. However, one of ordinary skill in the art will realize that the invention may be practiced without the use of these specific details.

An object of the invention is directed to providing a technique of fabrication heterogeneous structures comprising III-V semiconductors and metal oxide dielectrics, with free of pinning high mobility interfaces there-between.

The heterogeneous structures are produced by a direct RF sputtering of the metal oxide material on the III-V semiconductor surface in the atmosphere containing argon and oxygen.

The Inventors suggest an original, alternative approach to fabrication the high mobility interface between GaAs and metal oxide dielectrics, which is the most important and demanded combination for the modern semiconductor industry. Exposure of the untreated semi-insulating GaAs wafers to the Ar/02 plasma during reactive RF sputtering of metal oxides leads to formation of the n-type conducting interfacial channel. Resistance of samples fabricated in the Ar/02 atmosphere can be as low as $10^5 \Omega$/down from $10^{10} \Omega$/ of those sputtered without oxygen. The n-type conductance channel is with the surface charge density of $10^7$ to $10^{10}$ cm$^{-2}$, depending on RF plasma excitation power and oxygen content during the deposition. Room temperature Hall mobility is up to 6000 cm$^2$/Vsec, which implies the self-cleaning of the GaAs surface from the native oxide defects and formation of the pinning-free interface. The conducting channel is formed during deposition of any of the tested metal oxide dielectrics: MgO, SiO$_2$, Al$_2$O$_3$ and HfO$_2$, of ZnO, or of any combination thereof.

Experimental Data

Metal oxide dielectrics: MgO, SiO$_2$, Al$_2$O$_3$ and HfO$_2$ were RF sputtered on 5 mm×5 mm slices of commercial SI—GaAs [001] wafers at room temperature. 500 μm thick compensated wafers, usually used as insulating substrates for film deposition, were supplied by different producers, including CMK and XTAL. Their room temperature resistance in dark was immeasurable (higher than 20 GO, which is the highest resistance value we were able to measure) but decreased to $10^9$-$10^{10} \Omega$ in the ambient laboratory illumination due to the light induced excitations. No chemical or thermal treatment of the wafers was done prior to deposition. The depositions were performed at 4 to 5 mtorr of argon with the added flow of air or 99.999% oxygen. The base chamber pressure prior to deposition was about $1 \times 10^{-7}$ torr.

Hygroscopic targets, such as MgO, exposed to the ambient atmosphere were cleaned by pre-sputtering for 20 minutes at 5 W/cm$^2$ rf power to remove the surface contaminated layer. The rf power density delivered to the targets varied between 2.5 W/cm$^2$ and 12 W/cm$^2$. Only a limited number of samples were fabricated at 12 W/cm$^2$ due to an excessive heat load. The deposition rate varied between 0.1 nm/sec to 0.3 nm/sec, subject to the applied power, target material and oxygen content in the chamber. Most of the samples were deposited in the home-made RF sputtering system using 2 inch targets (ACI alloys Inc.) located 20 cm from the substrate. A number of control samples were deposited in the commercial Vinci Technologies magnetron sputtering installation. All samples fabricated in both systems demonstrated similar properties. Two types of electric contacts were used: (i) NiGeAu alloyed Ohmic contacts grown on GaAs substrate prior to depositing the metal oxides films; (ii) alternatively, Al/Si wires were bonded to the film surface after the deposition. Both types of contacts revealed the same results. Resistance and Hall effect measurements were done using the Van der Paw four contacts protocol. Four probe and two-probe measurements using the Keithley electrometer were used for the high resistance samples in the G range. The results of the two probe measurements were consistent with the four probe ones. Structural analyzes were done by X-ray diffraction, high-resolution transmission electron microscopy, cross-sectional TEM, TOF-SIMS and XPS.

RESULTS AND DISCUSSION

FIG. 1 presents the resistance of a semi-insulating GaAs wafer sample measured in situ during the RF sputtering deposition of MgO in Ar/O2 atmosphere at different partial pressures of argon and oxygen. Electric contacts were attached to the substrate prior to the deposition. The actual four-probe resistance measurement in the Van der Paw configuration was performed at given time intervals with switched-off rf power. Deposition was resumed after each measurement. Resistance in dark of the GaAs substrate prior to the deposition exceeded 20 G and remained immeasurable when MgO was sputtered in a pure Ar atmosphere. The sample remained insulating, as would be expected when an insulating metal oxide is deposited on an insulating substrate. When oxygen was added to Ar, the resistance started dropping immediately with the beginning of the sputtering. The resistance decrease stopped after about 30 minutes of sputtering when an average thickness of the grown MgO layer exceeded 2 nm. No significant changes of resistance were observed when more MgO was deposited. Since the final resistance doesn't depend on the thickness of the deposited film, we attribute the conductance to the interfacial layer formed at the early stages of the sputtering. Similar deposition performed in the mixed argon/nitrogen atmosphere produced no measurable conductance. Reactive sputtering of MgO in Ar/O2 atmosphere on glass, quartz and GaN substrates resulted in the insulating material. Thus, GaAs is the only one of the tested insulating substrates that becomes conducting during the reactive sputtering of the metal oxide dielectric. We shall denote the samples fabricated by depositing MgO in presence of oxygen in the sputtering plasma as GaAs(O)/MgO.

Figure 2:
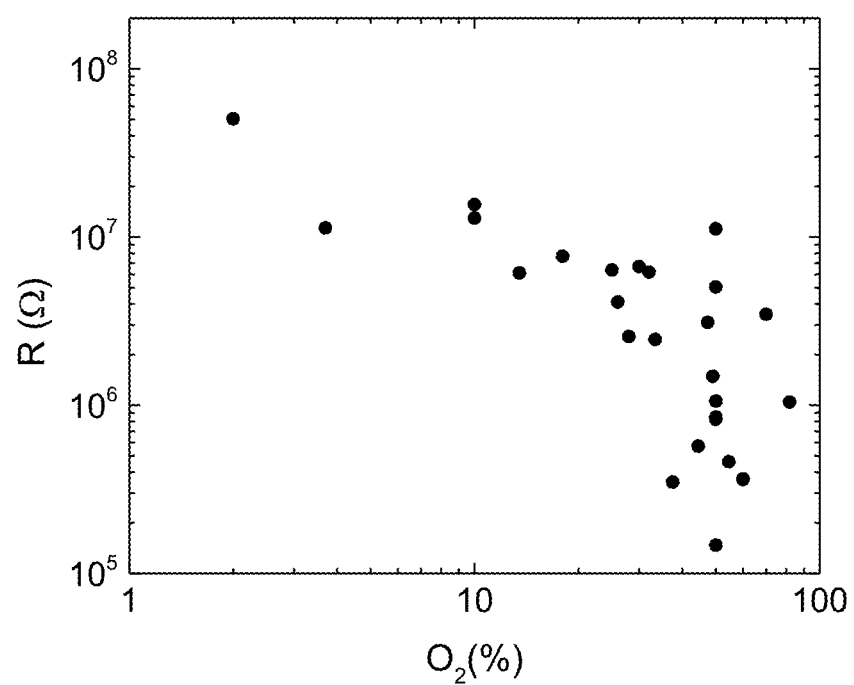
FIG. 2 presents the resistance of multiple GaAs(O)/MgO samples deposited at different power on different wafers as a function of oxygen concentration in the plasma. The measurements were done shortly after the fabrication and may characterize the obtained heterogeneous structure/device. The depositions were done at 150 and 250 W RF power.

Resistance of the conducting interface depends on the deposition conditions including the oxygen concentration, RF power and the substrate used, but also on illumination and time elapsed after the fabrication. FIG. 2 presents the resistance of multiple GaAs(O)/MgO samples deposited at different power on different wafers as a function of oxygen concentration in the plasma. The measurements were done shortly after the fabrication. The onset of conductance can be traced when as little as 2% of oxygen was added to argon at 12 W/cm$^2$ power density. The resistance decreases gradually with increasing oxygen content up to about 50% where the data become scattered. Notably, the resistance can be as low as $10^5 \Omega$/ in samples fabricated in oxygen rich atmosphere.

Figure 3:
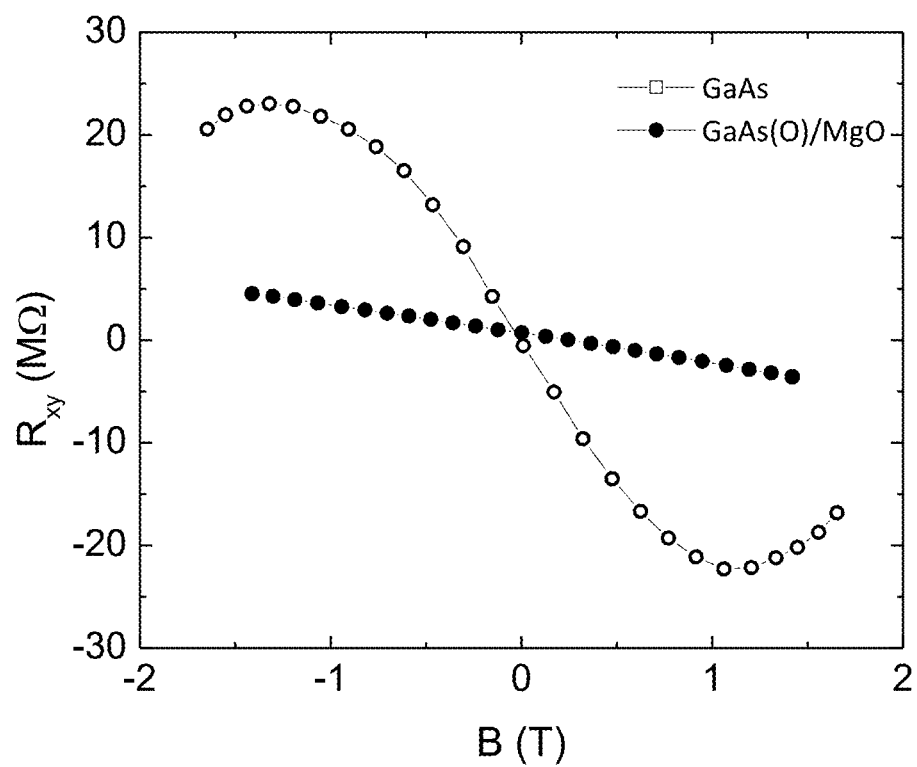
FIG. 3 illustrates the qualitative difference in the Hall effect between the sample cut from the untreated GaAs wafer and the same wafer with the reactively sputtered MgO layer. Namely, the figure shows Hall resistance $R_{xy}$ of the GaAs sample (open circles) cut from the untreated wafer and the GaAs(O)/MgO sample deposited on the same wafer (solid circles) as a function of magnetic field applied normal to the plane. The measurements were done in the illuminated laboratory conditions when the zero field resistance of the GaAs and GaAs(O)/MgO samples were 1.3 GΩ and 10 MΩ respectively.

The density of the charge carriers and their mobility were extracted from the Hall effect measurements. FIG. 3 illustrates the qualitative difference in the Hall effect between the sample cut from the untreated GaAs wafer and the same wafer with the reactively sputtered MgO layer. The measurements were done in the illuminated laboratory conditions when the zero field resistance of the GaAs sample was 1.3 G. The Hall resistance $R_{xy}$ is not linear and not monotonic in field, which together with the parabolic in field magnetoresistance is typical for the conductance by two (or more) charge carriers in the compensated semi-insulating GaAs [Ref]. Resistance of the GaAs(O)/MgO sample is about 10 MΩ. Its Hall resistance is a linear function of field with a negative constant in field Hall effect coefficient $$R_H = \frac{dR_{xy}}{dB}.$$

Linearity of the Hall resistance indicates the dominance of a single negative charge carrier.

The planar charge carrier density n and Hall mobility μ were calculated from the resistance and Hall coefficient as:

$$n = -(R_H e)^{-1} \text{ and: } \mu = (enR_\square)^{-1} = \frac{R_H}{R_\square}$$

Where $R_\square$ is the planar resistance (per square).

Figure 4:
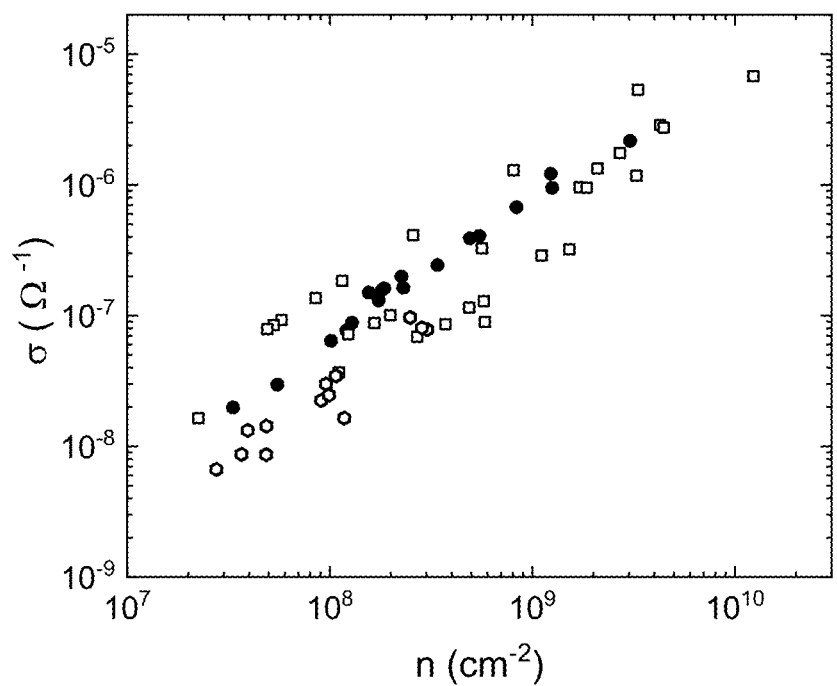
FIG. 4 presents the conductance $\sigma = R_\square^{-1}$ of multiple GaAs(O)/MgO samples deposited at different conditions as a function of their planar carrier density. Samples deposited at 250 W power are marked by solid circles.

FIG. 4 presents the conductance $\sigma = R_\square^{-1}$ of multiple GaAs(O)/MgO samples deposited at different conditions as a function of their carrier density. The carrier density varies between $10^7$ cm$^{-2}$ to $10^{10}$ cm$^{-2}$, while the value of $10^7$ cm$^{-2}$ corresponds to the density of the GaAs wafer itself (see FIG. 3). Thus, the reactive sputtering produces additional carriers in the conduction band increasing their density by up to 3 orders of magnitude to $10^{10}$ cm$^{-2}$. The conductance follows the charge density and increases over three orders of magnitude between $10^{-8}$ (Ω/)$^{-1}$ up to $10^{-5}$ (Ω/)$^{-1}$ in the sample with the highest carrier density $10^{10}$ cm$^{-2}$. The entire data follow a clear Drude-type correlation between the conductance and the charge carrier density: σ∝n.

Figure 5:
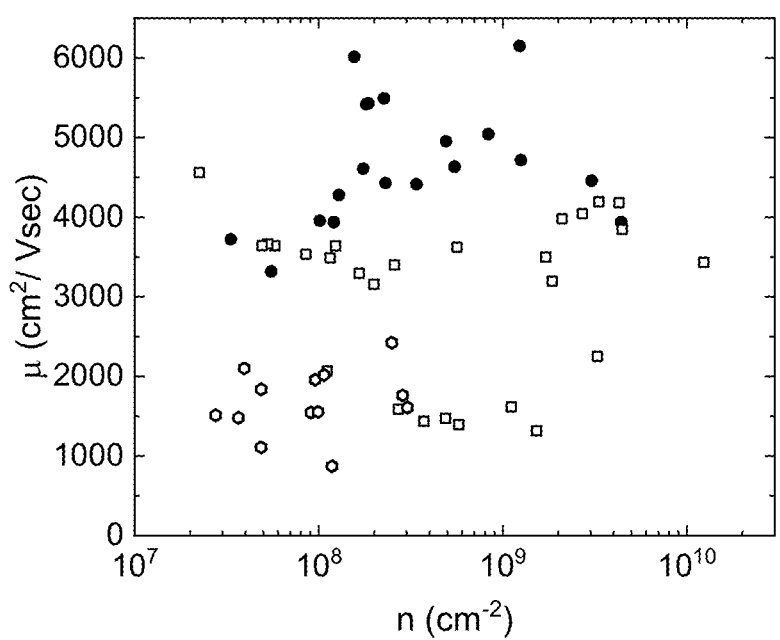
FIG. 5 presents the Hall mobility in GaAs(O)/MgO samples as a function of their planar charge carrier density.
Figure 6:
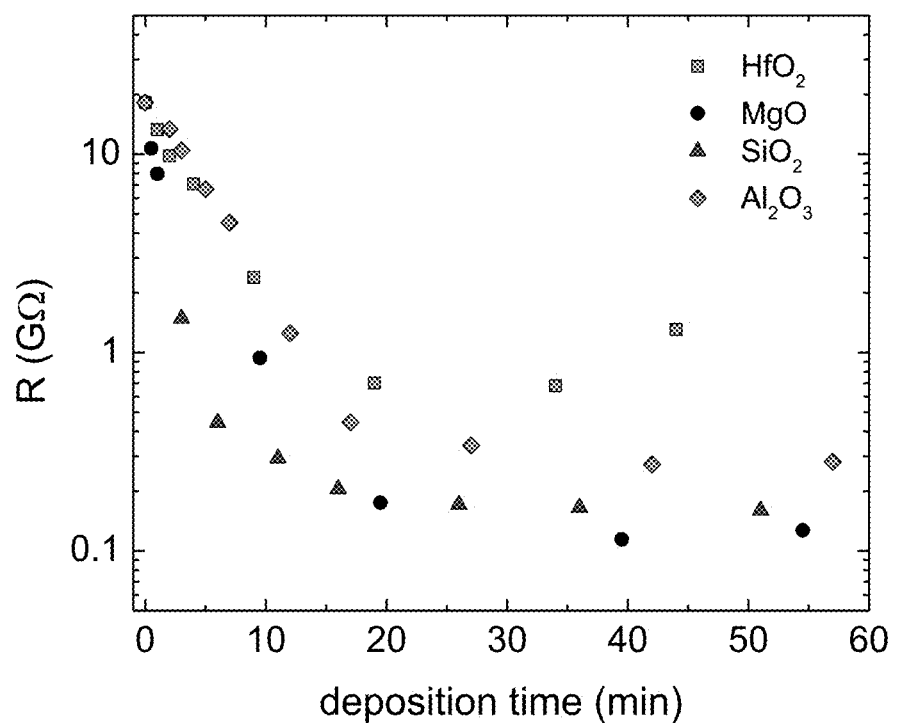
FIG. 6 presents the resistance of GaAs wafer samples during the reactive sputtering of four principal metal oxide dielectrics: MgO, SiO$_2$, Al$_2$O$_3$ and HfO$_2$. The drawing presents the resistance as a function of the deposition time measured in situ during the RF sputtering of HfO$_2$, MgO, SiO$_2$ and Al$_2$O$_3$ on untreated GaAs wafer in Ar/02 atmosphere. RF power $P_{RF}$=150 W.

FIG. 5 presents the mobility in GaAs(O)/MgO samples as a function of the charge carrier density. Despite a relatively large dispersion of data, mobility of all samples produced by the reactive sputtering of MgO on different GaAs wafers at different powers, oxygen concentrations and the overall plasma pressures falls between 1000 cm$^2$/Vsec and 6000 cm$^2$/Vsec. The highest mobility was found systematically in samples fabricated at 250 W rf power. The effective planar mobility of the illuminated GaAs substrate estimated from the data in FIG. 3 is about $10^2$ cm$^2$/Vsec. Thus, the mobility of the interface is enhanced by at least an order of magnitude and exceeds 6000 cm$^2$/Vsec in some samples. This mobility is comparable to the highest mobility found at room temperature in GaAs crystals and equals to that obtained in high mobility GaAs/AlGaAs heterointerfaces [High Electron Mobility Transistor Logic, Takashi Mimura, Kazukiyo Joshin, Satoshi Hiyamizu, Kohki Hikosaka and Masayuki Abe, Jpn. J. Appl. Phys. 20 L598 (1981)]. It exceeds by far the highest values reported in the passivated III-V semiconductors: 500 cm$^2$/Vs in n-doped GaAs channel with atomic-layer deposited Al$_2$O$_3$ as the gate oxide [Wu, Y. Q.; Xu, M.; Ye, P. D.; Cheng, Z.; Li, J.; Park, J.-S.; Hydrick, J.; Bai, J.; Carroll, M.; Fiorenza, J. G.; Lochtefeld, A. Appl. Phys. Lett. 2008, 93, 242106]; 885 cm$^2$/Vsec in GaAs passivated by a thin amorphous Si cap [De Souza, J. P.; Kiewra, E.; Sun, Y.; Callegari, A.; Sadana, D. K.; Shahidi, G.; Webb, D. J.; Fompeyrine, J.; Germann, R.; Rossel, C.; Marchiori, C. Appl. Phys. Lett. 2008, 92, 153508] and the peak value electron mobility of 1190 cm$^2$/Vsec reported in ALD fabricated InAs MOSFET with ZrO$_2$ dielectric [J. Nah, H. Fang, C. Wang, K. Takei, M. H. Lee, E. Plis, S. Krishna, and A. Javet, III-V complementary metal-oxide-semiconductor electronics on silicon substrates, Nano Lett. 12 (2012) 3592-3595, doi:10.1021/n1301254z.].

Formation of the conductance channel during the reactive sputtering of dielectrics on GaAs is a general property. FIG.

6 presents the resistance of GaAs wafer samples during the reactive sputtering of four principal metal oxide dielectrics: MgO, $SiO_2$, $Al_2O_3$ and $HfO_2$. Development of the conducting channel is common to all of them: the resistance starts dropping immediately with exposing the GaAs substrate to the incoming flux and saturates when the deposited dielectric layer covers GaAs by a continuous layer.

Figure 7:
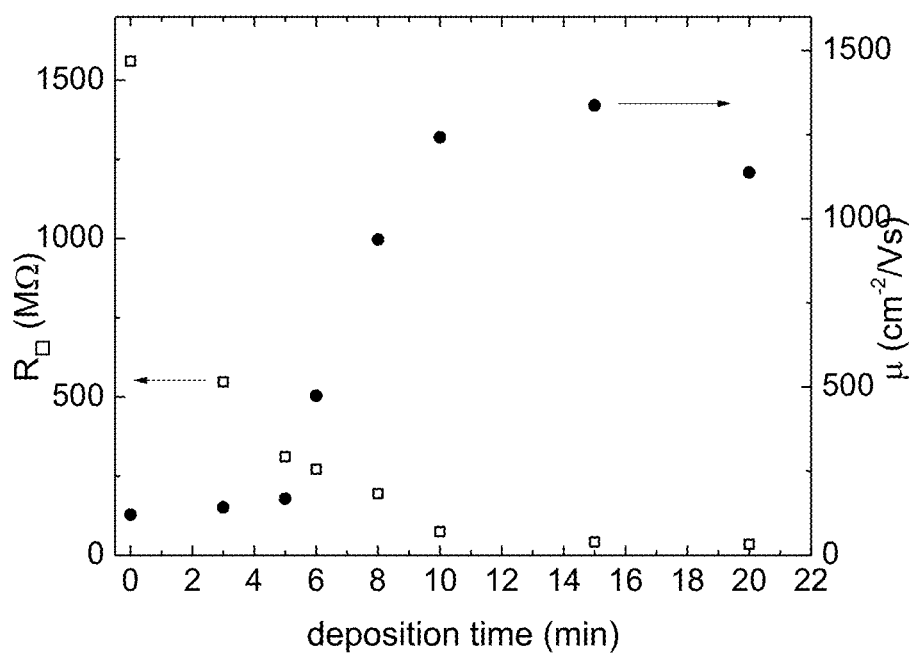
FIG. 7 (details of deposition), presents the development of mobility as a function of the deposition time, together with the respective reduction of resistance. The resistance (left vertical axis) and mobility (right vertical axis) of a series of GaAs(O)/MgO samples are each a function of the reactive sputtering deposition time. RF power $P_{RF}$=150 W.

Transformation of the GaAs interface occurs gradually during the sputtering process. FIG. 7 (details of deposition) presents the development of mobility as a function of the deposition time, together with the respective reduction of resistance. This series of samples were fabricated at an exemplary 7.4 W/cm$^2$ power density at 1:1 $O_2$/Ar ratio on substrates cut from the same wafer. Resistance and Hall coefficient were measured outside the sputtering chamber. The mobility increases gradually during the deposition and saturates when MgO covers the substrate by 2 nm thick layer. The resistance decreases and saturates respectively.

Figure 8:
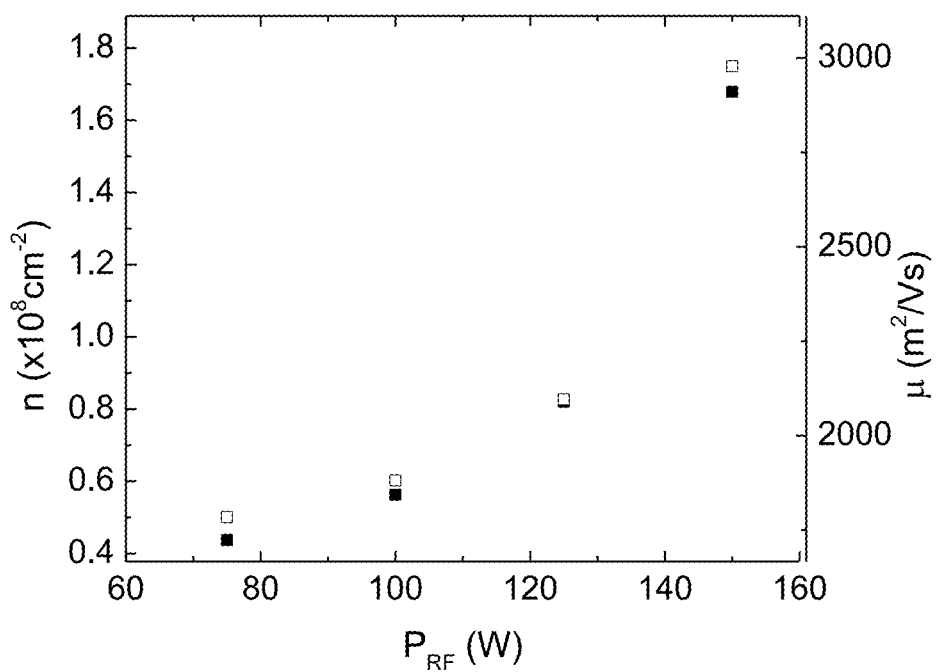
FIG. 8 shows that the plasma excitation power during the RF sputtering is important in defining the properties of the conducting channel. Planar charge carrier density (left vertical axis) and mobility (right vertical axis) of a series of GaAs(O)/MgO samples are each a function of the RF sputtering power.

The plasma excitation power is important in defining the properties of the conducting channel, as illustrated in FIG. 8. The mobility and the carrier density of a series of GaAs(O)/MgO samples are shown as a function of the RF power used during the sputtering. All samples were deposited on pieces cut from the same segment of the GaAs wafer in the same 1:1 Ar/02 atmosphere. Both the carrier density and the mobility increase with the excitation power and, notably, both seem to follow the same functional dependence of the power.

The results presented here are quite surprising after so many dedicated efforts to fabricate the defect-free interface between GaAs and metal-oxides. A number of characterization tools were employed in attempt to reveal the compositional or structural uniqueness of GaAs(O)/MgO samples. The cross-sectional high resolution TEM, XPS and TOF-SIMS tests did not reveal a measurable difference between samples sputtered with and without oxygen, although their conductance properties differed by orders of magnitude. The cross-section TEM analysis of one of the samples indicated the formation of $Ga_2O_3$ interface layer between GaAs and $SiO_2$ overlayer, however this observation was not confirmed in other samples. One can speculate that reactive sputtering leads to redistribution of the surface oxides favoring the more stable $Ga_2O_3$ that makes the pinning free interface with GaAs when deposited in situ. Similar to the atomic layer deposition, the process of self cleaning occurs at the very early stages of the reactive sputtering exposure, and the process is terminated when the layer of the metal oxide covers GaAs. Exposure to the Ar/$O_2$ plasma is a standard procedure used to clean the GaAs surfaces. However, such a process alone without passivation, performed using the Plasma Asher system, did not improve either conductance or mobility. Therefore, the very presence of the metal oxide layer formed simultaneously with exposure of the surface to reactive plasma seems to protect and conserve the high mobility properties of the interfacial channel.

CONCLUSIONS

To summarize, the semi-insulating GaAs used as a substrate for film deposition, becomes conducting during the reactive sputtering of insulating metal oxide dielectrics in Ar/02 plasma. The conducting interfacial channel generated during the process is n-type with the surface charge density of $10^7$ to $11^{10}$ cm$^{-2}$, depending on RF plasma excitation power and oxygen content during the deposition. Room temperature Hall mobility is up to 6000 cm$^2$/Vsec, the value approaching the room temperature mobility of clean GaAs crystals. The conducting channel is formed during deposition of any of the tested metal oxide dielectrics: MgO, $SiO_2$, $Al_2O_3$ and $HfO_2$. Other metal oxide dielectrics (for example, ZnO) are believed to demonstrate the same effect. Such dramatic enhancement of the charge carrier density and improvement of mobility imply the self-cleaning of GaAs surface from the native oxide defects and formation of the pinning-free interface.

The Inventors have proposed at least 3 implementations/devices which are characterized by the dramatically high charge density and improved mobility, and which may be manufactured by the suggested method:

1. MOSFET (metal oxide semiconductor field effect transistor) in which the insulating dielectric is deposited on III-V semiconductor.
2. Hall Effect device with low carrier density and high carrier mobility (the device that used to measure the magnitude of a magnetic field).
3. Device containing III-V semiconductor-metal oxide insulator element, in which the charge carrier density is modulated either by a wide spectrum light or by illumination in the selected frequency range.
   Results obtained in the samples fabricated by the proposed method are superior to the previously known

Having thus described several embodiments for practicing the inventive method, its advantages and objectives can be easily understood. Variations from the description above may and can be made by one skilled in the art without departing from the scope of the invention.

Accordingly, this invention is not to be limited by the embodiments as described, which are given by way of example only and not by way of limitation.

REFERENCES

1. J. A. del Alamo. Nanometre-scale electronics with III-V compound semiconductors. Nature 479, 317-323 (2011)
2. H. Hasegawa, et al. Surface passivation of III-V semiconductors for future CMOS devices-Past research, present status and key issues for future Applied Surface Science 256, 5698 (2010) https://www.sciencedirect.com/science/article/pii/S016943321000382X
3. Hideki Hasegawa, Masamichi Akazawa. Surface passivation technology for III-V semiconductor nanoelectronics. Applied Surface Science, Vol. 255:628-632 (2008) https://www.sciencedirect.com/science/article/pii/S0169433208015754
4. Michel Houssa, Evgueni Chagarov and Andrew Kummel. Surface Defects and Passivation of Ge and III-V Interfaces. https://www.cambridge.org/core/journals/mrs-bulletin/article/surface-defects-and-passivation-of-ge-and-iiiv-interfaces/74CA9F17EE9E85B03B4D7FFOAFE4DA9A (2011).
5. M. L. Huang, Y. C. Chang, C. H. Chang, Y. J. Lee, and P. Chang. Surface passivation of III-V compound semiconductors using atomic-layer-deposition-grown $Al_2O_3$. Appl. Phys. Lett. 87, 252104 (2005); https://aip.scitation.org/doi/abs/10.1063/1.2146060
6. D. Shahrjerdi, Junghyo Nah, B. Hekmatshoar and Tarik Akyol. Hall mobility measurements in enhancement-mode GaAs field-effect transistors with $Al_2O_3$ gate dielectric. Applied Physics Letters, 97(21):213506-213506-3 (2010).

The invention claimed is:

1. A heterogeneous structure comprising:
a semiconductor and a layer of a dielectric grown on a surface of the semiconductor, the structure having an interface between the dielectric and the semiconductor, wherein the semiconductor is passivated while depositing the dielectric on the surface of the semiconductor,
wherein the semiconductor is passivated via RF sputtering in presence of oxygen,
thereby obtaining a high mobility interface between the semiconductor and the dielectric,
wherein said interface is formed between the semiconductor GaAs and the dielectric MgO, the interface having the charge mobility in a range from about 1000 to more than 3000 cm$^2$/Vs.

2. The structure of claim 1, wherein the structure has a charge mobility μ being close to or higher than the charge mobility of the bulk semiconductor.

3. The structure of claim 1, wherein the dielectric comprises one or more metal oxides.

4. The structure of claim 3, wherein the dielectric comprises one or more metal oxides selected from a group comprising MgO, SiO$_2$, HfO$_2$ ZnO, Al$_2$O$_3$.

5. The structure of claim 1, in which the charge mobility of said interface is greater than or equal to 10$^3$ cm$^2$/Vsec at room temperature.

6. The structure of claim 1, wherein the semiconductor is selected from a group consisting of a semi-insulating, non-doped semiconductor, an n-type semiconductor or a p-type doped semiconductor.

7. A semiconductor device incorporating the structure of claim 1, wherein the device is a MOSFET or a Hall effect sensor.

* * * * *